(12) United States Patent
Carroll et al.

(10) Patent No.: US 11,880,744 B2
(45) Date of Patent: Jan. 23, 2024

(54) TOPOLOGICAL QUANTUM COMPUTING COMPONENTS, SYSTEMS, AND METHODS

(71) Applicants: Streamline Automation LLC, Huntsville, AL (US); Wake Forest University, Winston Salem, NC (US)

(72) Inventors: David L. Carroll, Winston-Salem, NC (US); Alton J. Reich, Huntsville, AL (US); Roberto Di Salvo, Cincinnati, OH (US)

(*) Notice: Subject to any disclaimer, the term of this patent is extended or adjusted under 35 U.S.C. 154(b) by 0 days.

(21) Appl. No.: 18/097,328

(22) Filed: Jan. 16, 2023

(65) Prior Publication Data
US 2023/0206107 A1    Jun. 29, 2023

Related U.S. Application Data

(62) Division of application No. 17/635,716, filed as application No. PCT/US2020/056725 on Oct. 21, 2020, now Pat. No. 11,580,437.

(60) Provisional application No. 62/924,150, filed on Oct. 21, 2019.

(51) Int. Cl.
| | |
|---|---|
| H01L 29/24 | (2006.01) |
| G06N 10/40 | (2022.01) |
| H01L 29/423 | (2006.01) |
| H01L 29/66 | (2006.01) |

(52) U.S. Cl.
CPC ............ *G06N 10/40* (2022.01); *H01L 29/24* (2013.01); *H01L 29/423* (2013.01); *H01L 29/66977* (2013.01)

(58) Field of Classification Search
CPC ....... G06N 10/40; H01L 29/24; H01L 29/423; H01L 29/66977; H01L 29/7613; H01L 27/18; H01L 39/223–226; H01L 22/10–14; B82Y 10/00; Y10S 977/933; H03K 19/195–1958; H10N 99/05
See application file for complete search history.

(56) References Cited

U.S. PATENT DOCUMENTS

| | | | | |
|---|---|---|---|---|
| 7,749,922 | B2* | 7/2010 | Bezryadin | H01L 29/7613 257/E29.322 |
| 2015/0279981 | A1* | 10/2015 | Eriksson | H01L 29/66977 257/14 |
| 2021/0265553 | A1* | 8/2021 | Voisin | H01L 29/16 |

OTHER PUBLICATIONS

Kharzeev, Mar. 19, 2019, "The Chiral Qubit: quantum computing with chiral anomaly", arXiv:1903. 07133v1, (Year: 2019).*

* cited by examiner

*Primary Examiner* — Shahed Ahmed
(74) *Attorney, Agent, or Firm* — Patent Grove AB; Tomas Friend

(57) ABSTRACT

A method for monitoring the state of a qubit device comprising a chiral nanocrystal includes measuring a voltage, a current, or a magnetic field of the nanocrystal; assigning the nanocrystal a superposition state if the measured voltage, current, or magnetic field is less than a superposition threshold; and assigning a base state value of the nanocrystal if the measured voltage is greater than a base state threshold. The measured voltage, current, or magnetic field corresponds to a clockwise or counter clockwise flow of electrons around the nanocrystal.

15 Claims, 3 Drawing Sheets

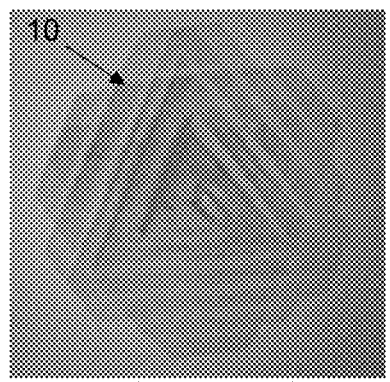 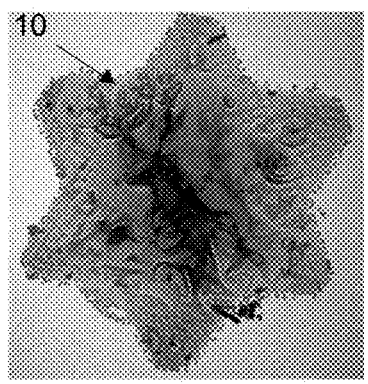 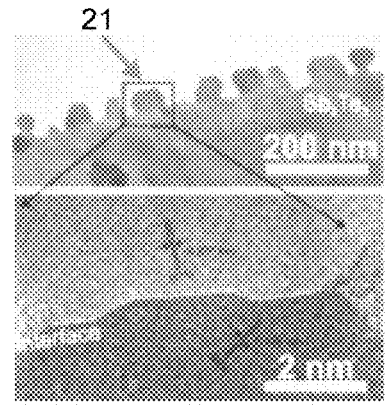
Fig. 1A     Fig. 1B     Fig. 1C
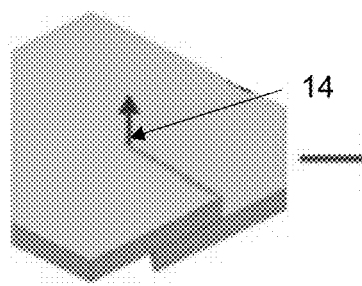 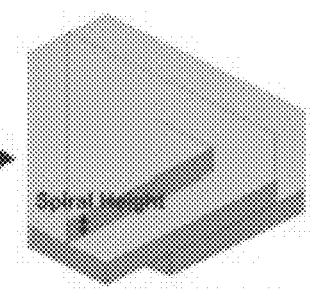 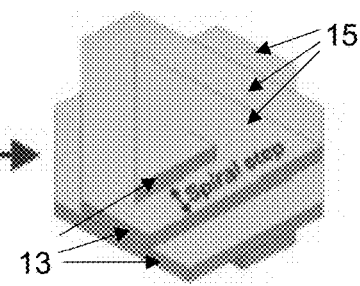
Fig. 2A     Fig. 2B     Fig. 2C
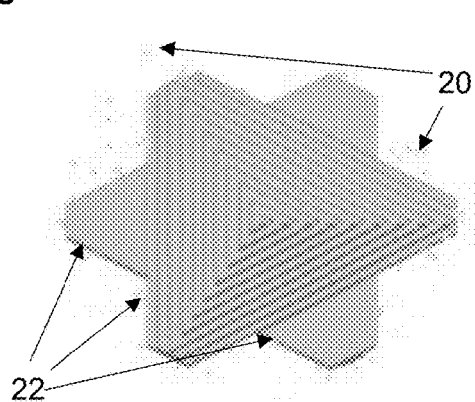 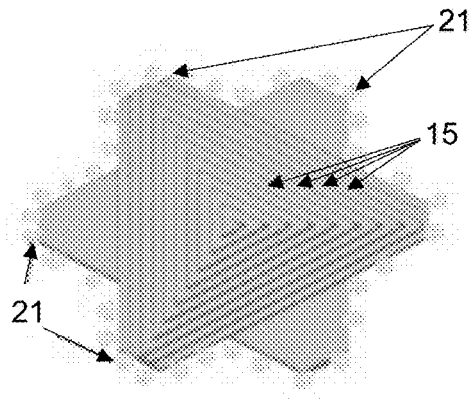
Fig. 2D     Fig. 2E

TOPOLOGICAL QUANTUM COMPUTING COMPONENTS, SYSTEMS, AND METHODS

RELATED APPLICATIONS

This application is a divisional of U.S. Ser. No. 17/635,716, which is the US National Stage entry of PCT/US20/56725 filed Oct. 21, 2020, which claims priority to U.S. 62/924,150 filed Oct. 21, 2019.

STATEMENT REGARDING FEDERALLY SPONSORED RESEARCH

This invention was made with government support under contract Nos. FA9550-16-1-0328 and FA8649-19-PA-435 awarded by the U.S. Air Force and Contract Nos. NNX16CJ30P and 80NSSC18C0003 awarded by NASA. The government has certain rights in the invention.

BACKGROUND OF THE INVENTION

Field of the Invention

The present invention relates generally to quantum bits and quantum computing systems and methods. More specifically, the present invention relates to topological quantum bits (qubits), quantum registers comprising qubits and computational systems and methods comprising topological qubits.

Description of Related Art

Quantum computing is a rapidly developing field in which quantum-mechanical phenomena such as superposition and entanglement are used to perform certain types of computations. Quantum computer circuits are based on quantum bits, also called "qubits or "qbits," which are the fundamental units of information in a quantum computer. A qubit is capable of existing in two states, 0 or 1, simultaneously or at different times. Multiple qubits are functionally coupled to make a quantum register, which is roughly the quantum analog of a classical processor register. Quantum logic gates (or quantum gates) are basic quantum circuits comprising a small number of qubits that can be combined to make larger quantum computing circuits.

To make a qubit stable, it is essential to protect it from outside interferences that can disrupt the quantum state, such as thermal noise and electromagnetic noise. Many require cryogenic temperatures approaching absolute zero to protect them from outside interferences that can disrupt the quantum state. The implementation of quantum computing is also limited by the short coherence time, or the length of time a prepared quantum state can be maintained, for existing qubits. This is, at least in part, because current quantum computing technology is based on entangling electrons, photons, or ions, which cannot be directly couple to electronic components.

WO 2018/190919 A9 describes composite semiconductor nanoparticle compositions and assemblies that exhibit enhancements to thermoelectric properties including increases in electrical conductivity, Seebeck coefficient, and decreases in thermal conductivity. The composite nanoparticle compositions comprise a semiconductor nanoparticle including a front face and a back face and sidewalls extending between the front and back faces and metallic nanoparticles can be bonded to at least one of the sidewalls establishing a metal-semiconductor junction. The semiconductor nanoparticles may comprise, for example, molybdenum sulfide ($MoS_2$), antimony telluride ($Sb_2Te_3$) or bismuth telluride ($Bi_2Te_3$) and may exhibit a bi-pyramidal structure. Metallic nanoparticles may be bonded to one or more sidewalls of the semiconductor nanoparticle. Suitable metals include metals selected from Groups IVA-VIIIA and Group IB of the Periodic Table. In one example, silver nanoparticles are bonded to sidewalls of a $Sb_2Te_3$ nanoparticle, wherein an interfacial transition region comprises $Sb_2Te_3$—$Ag_2Te$—Ag.

BRIEF SUMMARY OF THE INVENTION

Embodiments of the present invention preferably seek to mitigate, alleviate or eliminate one or more deficiencies, disadvantages or issues in the art, such as the above-identified, singly or in any combination by providing a qubit, a qubit register, a quantum computer, a method of making a quibit, a method of making a qubit register, and a method of making a quantum computer.

The inventors have discovered that at least some semiconductor nanoparticles of the types disclosed in WO 2018/190919 A9 can be used to make qubits and that qubits comprising the nanoparticles are operable at much higher temperatures than existing qubits, are less susceptible to interference, and have longer coherence times than existing materials used to make qubits. Additionally, the state of the qubits comprising certain types of semiconductor nanoparticles disclosed in WO 2018/190919 A9 may be measured by means that are less complex and less expensive than those required for existing quantum computers. Qubits described herein may also be used as components of atomic clocks, quantum navigation sensors, quantum key distribution systems, and entanglement-enhanced microscopes, for example. Embodiments of the qubits, registers, and logic gates can have sizes on the micrometer scale, making their manufacture and operation simpler and less expensive than existing qubits, registers, and logic gates. Additionally, the states of the qubits may be measured by means that are less complex and less expensive than those required for exiting quantum computers. As a consequence, the invention enables quantum computing to be mobile and not limited to the cloud.

In one aspect, the invention provides a qubit device comprising a semiconductor nanocrystal immobilized on a substrate in which the nanocrystal has a superposition state or a base state of an electron current associated with the nanocrystal.

In another aspect, the invention provides for a register comprising a plurality of qubit devices.

In yet another aspect, the invention provides for a method for monitoring a state of a qubit device comprising a chiral nanocrystal.

In yet another aspect, the invention provides for a method for making a quantum register comprising semiconductor nanocrystal qubits.

BRIEF DESCRIPTION OF THE DRAWINGS

The elements of the drawings are not necessarily to scale relative to each other, with emphasis placed instead upon clearly illustrating the principles of the disclosure. Like reference numerals designate corresponding parts throughout the several views of the drawings in which:

FIG. 1A is a top view transmission electron micrograph of a transition metal dichalcogenide (TMD) nanoplatelet (or nanocrystal) of the type used to create a qubit;

FIG. 1B is a top view scanning electron micrograph of a TMD nanoplatelet with nanoparticles of silver bonded to the edges of the nanoparticle along its central plane;

FIG. 1C shows two comparative enlarged scale images of an interface between a metal nanoparticle and TMD nanoplatelet;

FIGS. 2A-2E show a sequence of events during the formation of a TMD nanoplatelet and a TMD nanoplatelet comprising metal nanoparticles;

DETAILED DESCRIPTION OF THE INVENTION

Figure 3:
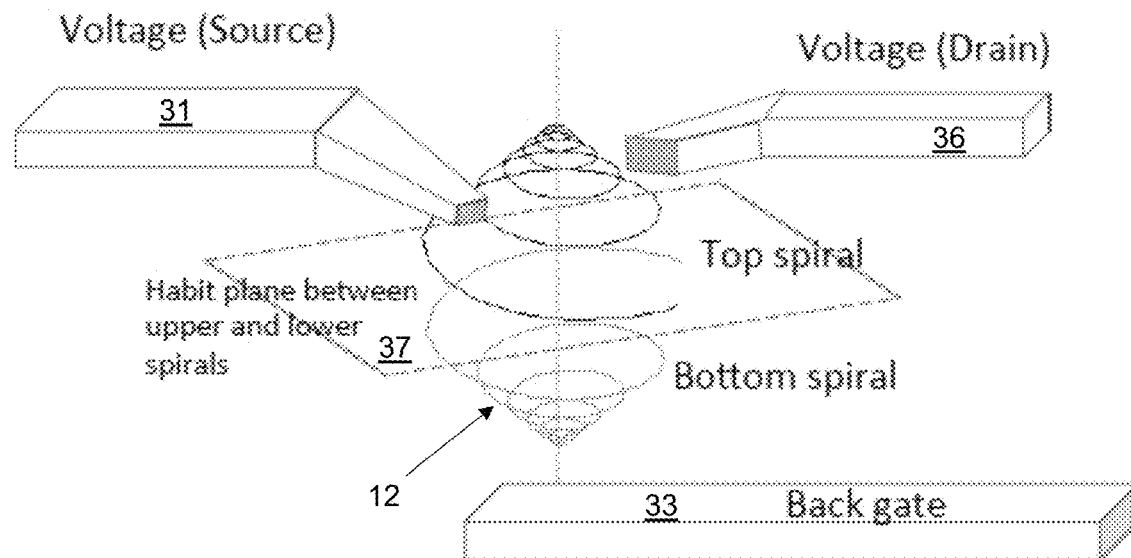
FIG. 3 is a schematic showing the basic structure of one embodiment of a qubit.

Specific embodiments of the invention are described with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements.

All art specific terms are intended to have their art accepted meaning unless otherwise specified. All non art specific words are intended to have their plain language meanings in the context with which they are used, unless otherwise specified.

As used herein, a nanoparticle or nanoplatelet is a particle having at least one dimension that is less than 1,000 nanometers, or 1 micrometer, in length.

Figure 6:
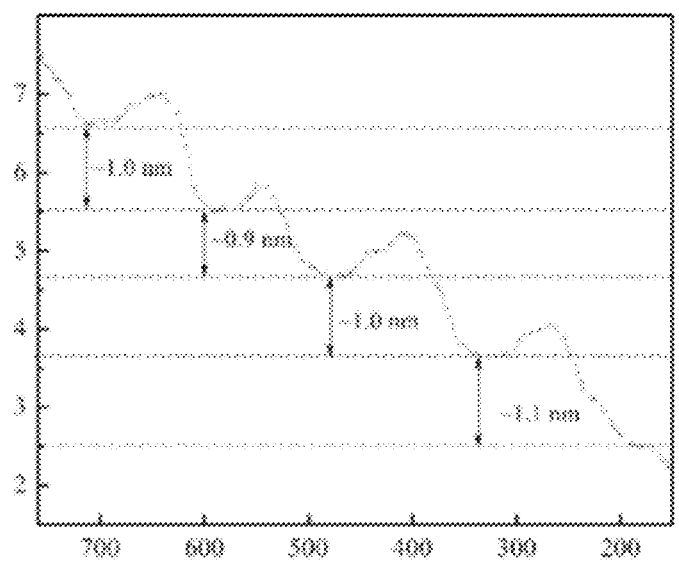
FIG. 6 is a combined atomic force and confocal microscope (AFM/CFM) graph showing profile of a nanoplatelet edge.

FIGS. 1A and 1B are top view transmission and scanning electron micrographs of a chiral, self-assembled, bipyramidal $Sb_2Te_3$ transition metal dichalcogenide (TMD) nanoplatelet/nanocrystal (10). FIGS. 2A-2E illustrate the process of forming a TMD nanoplatelet (10). The nanocrystal (10) comprises a top, or front, face (11, FIG. 3) and a back, or bottom, face (12, FIG. 3) and sidewalls (13) extending between them. The nanocrystals (10) may be produced using solvent engineering processes for making self-assembled nanoparticles disclosed in WO 2018/190919 A9, which are incorporated herein by reference, especially methods for making $MoS_2$, $Sb_2Te_3$ and $Bi_2Te_3$ self-assembled nanoporticles. During the process, a crystal lattice forms around a central axis (14, FIG. 2A) and forms sequential layers (15) growing in opposite directions with opposite chiralities, with clockwise and counter clockwise turns moving axially from the center along the central axis upwards and downwards, respectively. Not to be bound by theory, it is believed that the complex topology of the nanoplatelet (10) results in conduction channels with properties not reflected in the basic band structure of the nanoplatelet. FIG. 6 is a graph from AFM/CFM measurements showing slight raising of edges (13) of sequential layers (15) not seen in previously reported bulk grown spirals. The areas that appear raised show an unexpected electron density of a particular topological nature. A magnetic moment calculated using AFM/EFM (electrostatic force microscopy) measurements indicates that a field strength sufficient to effect entanglement at room temperature for the TMD nanoplatelets (10).

A characteristic of these sub-micron sized TMD nanocrystals (10) is that they can be defined by the spiral topological path for current flow along the edge of the upper and lower half of the nanoparticle/nanoplatelet (10) (FIG. 3). This provides a unique way of establishing two state superpositions at much higher temperatures than existing systems. A topological current runs along the spiral of the top face (11) from the basal habit plane (37) to the top and back along the central dislocation (not shown). This current does not cross the habit plane (37) onto the lower half (12) because this would break charge-parity symmetry. The topological states are charge parity invariant so mirror currents are established in the two halves. While the object is electrically neutral, one current direction dominates for any given measurement so that any measurement of current along the outside edges (13) will give a + or − current following the spiral but never zero. This established bistability using topology to make the state is not currently predicted by theories of topological quantum computing.

FIGS. 2D and 2E show the formation of metal nanoparticles (21) along the central, outside edge (22) of the nanoparticle from metal ions (20). The presence of nanoparticle dopants such as silver, gold, platinum, copper and other Group IVA-VIIIA and Group IB metals may be used to form metallic nanoparticles bonded to at least a portion of the outside edge (22) or other side walls (13) and establishing a metal semiconductor junction that may be used to increase electron density. For example, $Bi_2Te_3$ and $Sb_2Te_3$ nanoplatelets may be decorated or doped with Ag nanoparticles by dispersing the nanoparticles in ethylene glycol and mixed with silver nitrate overnight at room temperature. The Ag decorated TMD nanoparticles may be recovered by washing with ethanol. $Bi_2Te_3$ and $Sb_2Te_3$ nanoplatelets (10) may be decorated or doped with Cu nanoparticles by dispersing the nanoparticles in ethylene glycol and mixed with cuprous iodide and cuprous chloride overnight at 60° C. The Cu decorated TMD nanoparticles may be recovered by washing with ethanol. Enlarged views of Ag nanoparticles on a $Sb_2Te_3$ nanoplatelets are shown in FIG. 1C.

Coherence across the structure means that the wavefunction for electrons at the surface are symmetric or antisymmetric across the habit plane (37) (FIG. 3). The topological complexity of these chiral nanoparticles/nanoplatelets (10) result in charge-parity protected states that are interacted to yield stable entanglement between the top and bottom halves or faces (11, 12) of the nanocrystal (10), each of which have either a central up current or down current. Consequently, the nanocrystal (10) behaves as one entangled object with two halves or faces (top spiral and bottom spiral in FIG. 3) entangled, making the nanocrystal (10) useful for a quantum bit, or qubit, for quantum computing. A moment projection at the central axis can be ↑ or ↓. For counterclockwise topological current, the result is ↑ and $V_{SD}$=+1 (for example). This means ↓ is associated with clockwise current flow and $V_{SD}$=−1. However, the top and bottom are correlated and when a back gate (33) coupled to the bottom of the nanoparticle (10) is used to force a large magnetic field or electric field across the whole structure, then top and bottom faces (11, 12) must be in an entangled state.

FIG. 3 is a drawing showing components of a qubit (30) according to one embodiment of the invention. A voltage source lead (31) and a voltage drain lead (36) are placed in contact with, or almost touching the surface of the top face (11) of the nanoplatelet (10). These leads (31, 36) function as a current sensing element (300) for sensing the direction of the electron current on the top face (11) of the nanocrystal (10). A back gate lead/electrode (33) placed in contact with, or almost touching the surface of the bottom face (12) of the nanoplatelet (10). The back gate electrode (33) can be pulsed to place the nanocrystal onto a state of superposition with respect to electron current. The direction of current is conveniently determined using an electrical field measurement such as the direction of a voltage drop using electrodes (31, 36). Additionally or alternatively, the direction of current may be measured using other current sensing means (300) such as a superconductor or magnet placed in apposition to the top of the nanoparticle to measure a magnetic field induced by the current. Additionally or alternatively, the current sensing means (300) may comprise electromagnetic sensors for measuring absorbance or reflectance of circularly polarized light by the electric and/or magnetic field induced by the electron current.

Figure 4:
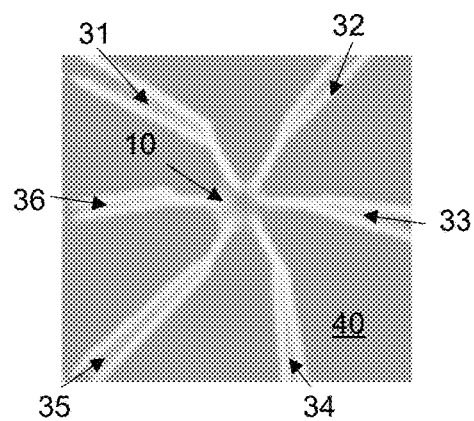
FIG. 4 is a photograph of a qubit comprising a nanoplatelet of the type shown in FIG. 1.
Figure 5:
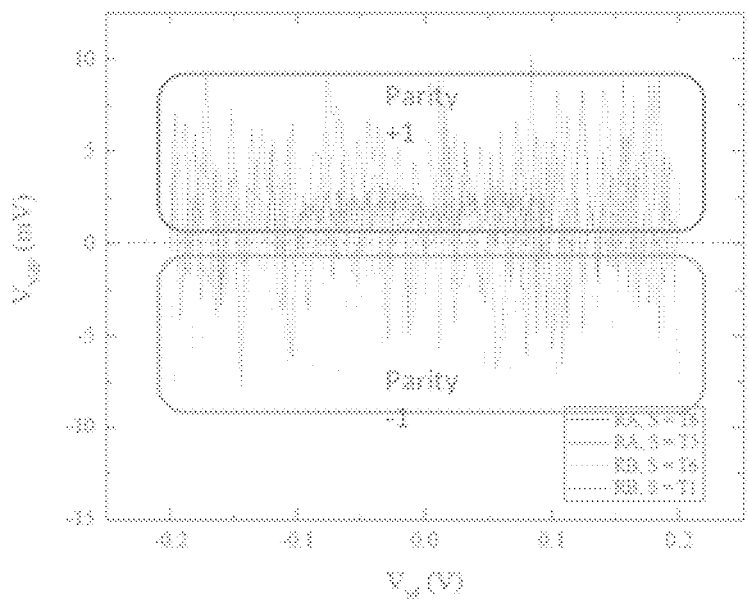
FIG. 5 is a graph showing measured voltages on a qubit of the invention.

FIG. 4 is a photograph of an actual qubit comprising a TMD nanocrystal (10) anchored on an insulating layer (41, not shown) that is formed over a gate electrode (33) on a nonconducting substrate (40), which may be made of silicon with an oxide surface or other suitable non-conducting material. In this example, a back gate electrode (33) is in contact with the bottom face (12) of the nanocrystal (10). A first electrode providing a voltage source (33) is in contact with a first position on an outer edge on the top face (11) of the nanoparticle (10) and a second electrode providing a voltage drain (36) is in contact with a second position on an outer edge on the top face (11) of the nanoparticle (10). A third electrode providing a voltage source (34) is in contact with a first position on an outer edge on the bottom face (12) of the nanoparticle (10) and a second electrode providing a voltage drain (35) is in contact with a second position on an outer edge on the bottom face (12) of the nanoparticle (10). The direction of the electron current in each of the top and bottom faces (11, 12) may be measured simultaneously by adding a shift in phase when voltage is applied and locating spikes in measured voltage in one or the other direction as shown in FIG. 5.

The functions of electrodes may be changed by changing applied voltages and the positions of leads (33) and (36) on the top half of the nanoparticle may be changed. Additional electrodes (32, 34, 35) are optional and may be used to apply and measure directional voltages, including phase shifted voltages, on the nanoparticle (10), to provide redundancy of function, or to provide connections to additional qubits, sensors, and/or a microprocessor controller for coordinating resetting and measurement times.

The minimum current required to measure voltage depends on the sensitivity of the measuring device. The presence of silver nanoparticles or other nanoparticle (21) dopants such as gold, platinum, copper and other Group IVA-VIIIA and Group IB metals may be used to form metallic nanoparticles bonded to at least a portion of the outside edge (22) or other side walls and establishing a metal semiconductor junction that may be used to increase electron density, if needed, to provide reliable measurable voltages. FIG. 1C shows a close up view of silver nanoparticles 21 on the edge 22 of a TMD nanocrystal (10). For any given qubit design, one may make a Hall measurement to determine detectable levels of current using a pico ammeter and adjust the presence or absence or type or amount of dopant as needed to achieve detectable levels of current.

Figure 7:
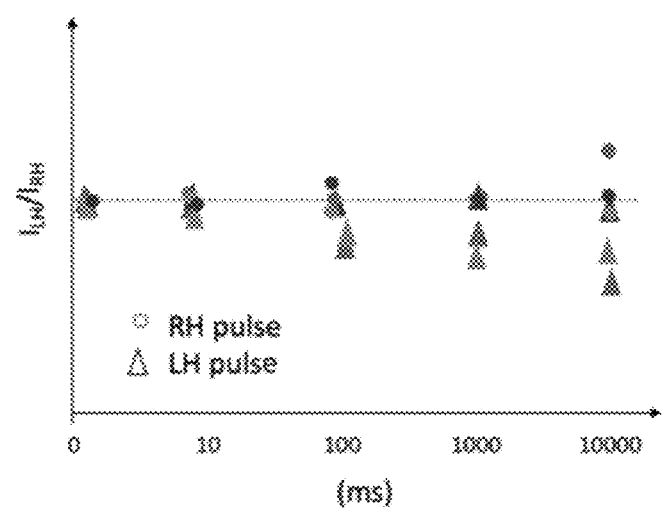
FIG. 7 is a graph comparing top and bottom side currents vs. decohering time.

FIG. 7 shows the results of measurements made using a qubit device similar to that shown in FIG. 4 in which measurements were made simultaneously on both the top and the bottom faces (11, 12) of the nanocrystal (10). The back gate (33) was pulsed by a microprocessor control element to put the nanocrystal into a superposition state and measurements between two top mounted leads (31, 36) and two bottom mounted leads (34, 35) were made. The LHC/RHC ratio of 1:1 was maintained up to 100 ms after superposition, indicating a coherence time at room temperature of 100 ms.

Qubits according to the invention may be made, for example, by forming a gate electrode (33) on a nonconducting substrate (40), forming an insulating layer (41) over the gate (33), immobilizing a semiconductor nanocrystal (10) onto the insulating layer (41) in contact with or in apposition to the gate electrode (33), and placing electrodes (31, 36) on or in apposition to the top half (11) of the crystal. Additional leads (34, 35) may also be formed on the nonconducting substrate (40) prior to immobilizing the semiconductor nanocrystal (10) onto the insulating layer (41).

The qubit devices may be combined to form a quantum register comprising a plurality of qubit devices entangled via coupling between charge quanta of said qubits. The qubit devices are not directly physically connected and the states of each of the qubit devices is read simultaneously. The qubit devices may be used to make quantum gates, including Pauli gates and quantum logic gates, and for making quantum circuits. A tremendous advantage of a qubit comprising a doped TMD nanocrystal is that cooling to cryogenic temperatures is not required because the qubits function at temperatures up to and including room temperature, for example −80° C., −40° C. −20° C., 0° C., 10° C., 20° C., and 25° C.

The invention claimed is:

1. A method for monitoring a state of a qubit device comprising a chiral nanocrystal, said method comprising:
   measuring a voltage, a current, or a magnetic field of said chiral nanocrystal;
   assigning a superposition state of said chiral nanocrystal if the measured voltage, current, or magnetic field is less than a superposition threshold value; and
   assigning a base state value of said chiral nanocrystal if the measured voltage is greater than a base state threshold value;
   wherein the measured voltage, current, or magnetic field corresponds to a clockwise or counter clockwise flow of electrons around the chiral nanocrystal.

2. The method of claim 1, wherein said chiral nanocrystal is a sub-micron sized Transition Metal Dichalcogenide (TMD) having a topological path for current flow along an edge of the chiral nanocrystal.

3. The method of claim 1, wherein said chiral nanocrystal comprises metal nanoparticles along an outside edge of said chiral nanocrystal.

4. The method of claim 1, wherein said measuring a voltage, a current, or a magnetic field of said chiral nanocrystal comprises determining the direction of a current along an outside edge of said chiral nanocrystal.

5. The method of claim 4, wherein said determining the direction of a current along an outside edge of said chiral nanocrystal comprises measuring a voltage drop between electrodes in contact with or in apposition to said chiral nanocrystal.

6. The method of claim 5, wherein said measuring a voltage drop comprises applying a voltage on the chiral nanocrystal.

7. The method of claim 6, wherein said applying a voltage on the chiral nanocrystal comprises applying a phase shifted voltage.

8. The method of claim 4, wherein said determining the direction of a current along an outside edge of said nanocrystal comprises measuring a magnetic field induced by said current.

9. The method of claim 4, wherein said determining the direction of a current along an outside edge of said nanocrystal comprises measuring absorbance or reflectance of circularly polarized light by an electric field or a magnetic field induced by said current.

10. The method of claim 4, wherein said determining the direction of a current along an outside edge of said nanocrystal comprises making a Hall measurement using a pico-ammeter.

11. The method of claim 1, wherein said qubit device comprises additional chiral nanocrystals and further comprising:

measuring a voltage, a current, or a magnetic field of each of said additional chiral nanocrystals;

assigning a superposition state of each of said additional chiral nanocrystals if the measured voltage, current, or magnetic field is less than a superposition threshold value; and assigning a base state value of each of said additional chiral nanocrystals if the measured voltage is greater than a base state threshold value;

wherein the measured voltage, current, or magnetic field corresponds to a clockwise or counter clockwise flow of electrons around each of the chiral nanocrystals.

12. The method of claim 1, further comprising placing the chiral nanocrystal in a superposition state with respect to electron current.

13. The method of claim 12, wherein said placing the chiral nanocrystal in a superposition state with respect to electron current comprises pulsing the chiral nanocrystal with a voltage.

14. The method of claim 1, wherein said measuring a voltage, a current, or a magnetic field of said chiral nanocrystal comprises sensing clockwise or counter clockwise flow of electrons using a first electrode in contact with or in apposition to a first location on a top face of the chiral nanocrystal and a second electrode in contact with or in apposition to a second location on a top face of the nanocrystal.

15. The method of claim 1, wherein said method is performed at a temperature of between −80° C. and 25° C.

* * * * *